United States Patent
Kim et al.

(10) Patent No.: US 9,684,164 B2
(45) Date of Patent: Jun. 20, 2017

(54) DIGITAL EXPOSURE DEVICE

(71) Applicant: SAMSUNG DISPLAY CO., LTD., Yongin, Gyeonggi-Do (KR)

(72) Inventors: Changhoon Kim, Asan-si (KR); Sanghyun Yun, Suwon-si (KR); Hikuk Lee, Yongin-si (KR); Jaehyuk Chang, Seongnam-si (KR); Cha-Dong Kim, Seoul (KR); Kibeom Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 590 days.

(21) Appl. No.: 14/169,215

(22) Filed: Jan. 31, 2014

(65) Prior Publication Data
US 2015/0025665 A1 Jan. 22, 2015

(30) Foreign Application Priority Data
Jul. 18, 2013 (KR) ........................ 10-2013-0084833

(51) Int. Cl.
*G06F 19/00* (2011.01)
*G02B 26/08* (2006.01)
*G03F 7/20* (2006.01)

(52) U.S. Cl.
CPC ..... *G02B 26/0866* (2013.01); *G03F 7/70291* (2013.01); *G03F 7/70475* (2013.01); *G03F 7/70508* (2013.01)

(58) Field of Classification Search
CPC ......... H01L 29/78603; G02F 1/136286; G03F 7/70258; G02B 26/0841; G02B 26/0858; G02B 26/0866
See application file for complete search history.

(56) References Cited

U.S. PATENT DOCUMENTS

| | | | |
|---|---|---|---|
| 2006/0269217 A1 | 11/2006 | Shirota et al. | |
| 2010/0059753 A1* | 3/2010 | Andrews | H01L 29/78603 257/59 |
| 2011/0096278 A1* | 4/2011 | Kim | G02F 1/136286 349/139 |
| 2012/0050705 A1 | 3/2012 | Washiyama et al. | |
| 2012/0262686 A1* | 10/2012 | Laidig | G03F 7/70258 355/53 |

FOREIGN PATENT DOCUMENTS

| | | |
|---|---|---|
| JP | 2007-101607 | 4/2007 |
| KR | 1020110064361 | 6/2011 |
| KR | 1020110073938 | 6/2011 |
| KR | 1020110120710 | 11/2011 |

* cited by examiner

*Primary Examiner* — Tuan Vu
(74) *Attorney, Agent, or Firm* — F. Chau & Associates, LLC

(57) ABSTRACT

A digital exposure device includes: a stage having a substrate seated thereon where a pattern is to be formed and moving in a scan direction; a data modification unit receiving design data and generating modified data by extending the design data; and a digital exposure unit receiving the design data and projecting a light controlled according to the design data on the substrate, wherein the modified data includes intermedial data corresponding to the size difference between an image of the design data and an image of the modified data and some of unit data forming the intermedial data are data obtained when unit data of the design data are shifted in any expansion direction.

19 Claims, 12 Drawing Sheets

DIGITAL EXPOSURE DEVICE

CROSS-REFERENCE TO RELATED APPLICATIONS

This application claims priority under 35 U.S.C. §119 to Korean Patent Application No. 10-2013-0084833 filed on Jul. 18, 2013, the disclosure of which is incorporated by reference herein in its entirety.

1. Technical Field

The inventive concept disclosed herein relates to a digital exposure device, and more particularly, to a digital exposure device improving resolution of patterned materials.

2. Discussion of the Related Art

In general, a method of forming a pattern on a substrate, which may be for implementing a liquid crystal display (LCD), a plasma display panel (PDP), and a flat panel display (FPD), includes: applying a pattern material (i.e. the material to be patterned) on the substrate first; selectively applying a photo mask material in a desired pattern on the pattern material and selectively exposing the pattern material by using the photo mask so as to selectively remove a chemically changed pattern material portion or a portion other than that.

However, as a substrate becomes larger and its pattern dimension becomes miniaturized, a digital exposure device forming a pattern with sufficient resolution on a substrate with a photo mask becomes more difficult. Alternatively, a digital exposure device forms a pattern through a method of directing a light beam to a substrate by using pattern information (e.g., digital pattern information) including electrical signals generated from an electronic device.

The digital exposure device may include a digital exposure device using grating light valve (GLV) and a digital exposure device using digital micro-mirror device (DMD).

The digital exposure device using GLV includes a diffraction grating light valve configured with one pair of two ribbons that controls the ON/OFF of the diffraction grating light valve by using optical interference occurring when an incident light is diffracted due to a position difference between the two ribbons. The digital exposure device using DMD includes a plurality of micro-mirrors configured to reflect an incident light of a predetermined angle at a desired angle and a light other than that at another angle. Only necessary light is used for exposure, without a light-blocking pattern.

SUMMARY

An aspect of the inventive concept provides a digital exposure device generating modified data to reduce stains or stitches occurring when a pattern is formed by extending design data. The modified data may be generated by linear interpolation or nonlinear interpolation of the design data to correlate with an observed or an expected thermal expansion of the substrate.

An aspect of the inventive concept provides digital exposure devices including: a data modification unit receiving design data and generating modified data by extending the design data; and a digital exposure unit receiving the design data and projecting a light controlled according to the design data onto a substrate, wherein the modified data includes intermedial data corresponding to the size difference between an image of the design data and an image of the modified data and some of unit data forming the intermedial data are data obtained when unit data of the design data are shifted in any expansion direction (e.g., any one of four orthogonal expansion directions). The digital exposure devices may further include stage configured to support a substrate where the pattern is to be formed seated thereon and wherein the stage is configured to move in a scan direction.

In some embodiments, the remaining unit data of the unit data forming the intermedial data may be data obtained when the unit data of the design data are not shifted in the first expansion direction.

In other embodiments, the design data may include design center data and edge data having pattern information on around the design center data.

In still other embodiments, the modified data may further include: center data identical to the design center data; and extended data obtained when the edge data are shifted in the first expansion direction.

In even other embodiments, the unit data forming the extended data and the some of the unit data forming the intermedial data may be shifted by the size unit of block data.

In yet other embodiments, the intermedial data may have the k number (k is a natural number) of intermedial block data between the center data and the extended data in the first expansion direction, and the ratio of unit data shifted in the first expansion direction among the unit data forming the intermedial block data may be $i/(k+1)$ (i is a natural number satisfying the following equation, $1/(k+1) \leq i/(k+1) \leq k/(k+1)$).

In further embodiments, the intermedial data may include a plurality of intermedial block data between the center data and the extended data in the first expansion direction, and the ratios of unit data shifted in the first expansion direction among unit data forming each of the intermedial block data may be different from each other.

In still further embodiments, the ratios of the unit data shifted in the first expansion direction among the unit data forming each of the intermedial block data may increase as it progressively approaches the first expansion direction.

In even further embodiments, the unit data forming the intermedial block data may be arranged in an m×n matrix (m and n are natural numbers).

In yet further embodiments, the number of unit data shifted in the first expansion direction among unit data of the intermedial block data forming one row may be $(n \times j)/(k+1)$ (j is a natural number satisfying the following equation, $n/(k+1) \leq (n \times j)/(k+1) < n$).

In yet further embodiments, the number of unit data shifted in the first expansion direction among unit data of the intermedial block data forming one column may be $(m \times u)/(k+1)$ (u is a natural number satisfying the following equation, $m/(k+1) \leq (m \times i)/(k+1) < m$).

In yet further embodiments, the k may be 1.

In yet further embodiments, the number of unit data shifted in the first expansion direction among unit data of the intermedial block data forming one row may be $n/2$.

In yet further embodiments, the number of unit data shifted in the first expansion direction among unit data of the intermedial block data forming one column may be $m/2$.

In yet further embodiments, each of unit data forming the design data and the modified data may corresponds to a positive integer multiple of a pixel area formed in the substrate.

In yet further embodiments, a boundary between adjacent unit data may not cross a thin film transistor formed on the pixel.

Exemplary embodiments of the inventive concept will be described below in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

Hereinafter, it will be described about an exemplary embodiment of the inventive concept in conjunction with the accompanying drawings.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF EXEMPLARY EMBODIMENTS

Figure 1:
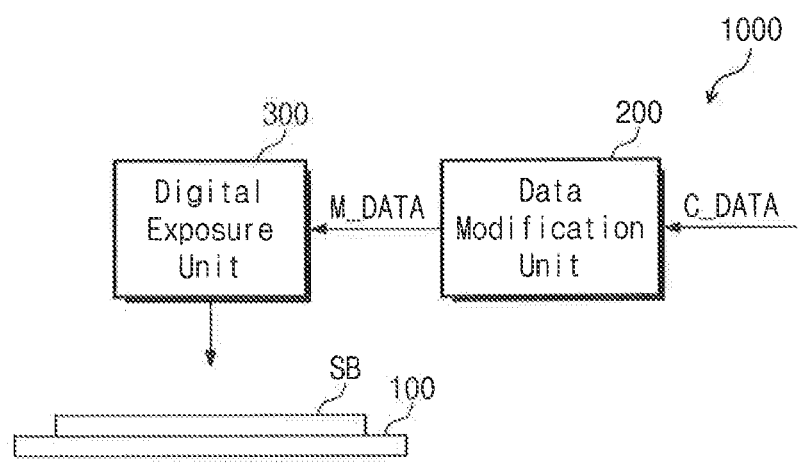
FIG. 1 is a view illustrating a digital exposure 1000 according to an embodiment of the inventive concept.

FIG. 1 is a view illustrating a digital exposure device 1000 according to an embodiment of the inventive concept.

Referring to FIG. 1, the digital exposure device 1000 includes a stage 100, a data modification unit 200, and a digital exposure unit 300.

The stage 100 is disposed below the digital exposure unit 300. A substrate SB is seated on the top surface of the stage 100. The substrate SB may be an object for forming a pattern upon it, such as a semiconductor wafer or glass.

The stage 100 moves and moves the substrate in a scan direction. As the stage 100 moves, the digital exposure unit 300 scans one side to the other side of the substrate SB in the scan direction.

The data modification unit 200 receives design data C_DATA from outside the digital exposure device 1000, and extends the received design data C_DATA to generate modified data M_DATA. Its details will be described later.

The digital exposure unit 300 receives the modified data M_DATA and controls light according to the received modified data M_DATA to project modulated light onto the substrate SB.

The digital exposure unit 300 may use a grating light valve (GLV) or a digital micro-mirror device (DMD).

A digital exposure unit using GLV may include a first light source, a GLV, and an optical system. The first light source provides a laser beam to the GLV. The GLV includes micro electro-mechanical systems (MEMS) device and changes the position of the MEMS device based on an electric current so as to control the diffracted state of light. The optical system focuses a reflected or diffracted light.

A digital exposure unit using DMD may include a second light source, a DMD, and a lens array. The second light source provides a laser beam to the DMD. The DMD includes a plurality of micro-mirrors arranged to be angularly adjustable. The micro-mirrors selectively reflect the laser light while it is turned on/off according to the modified data M_DATA. The lens array focuses the light reflected from the DMD.

Figure 2:
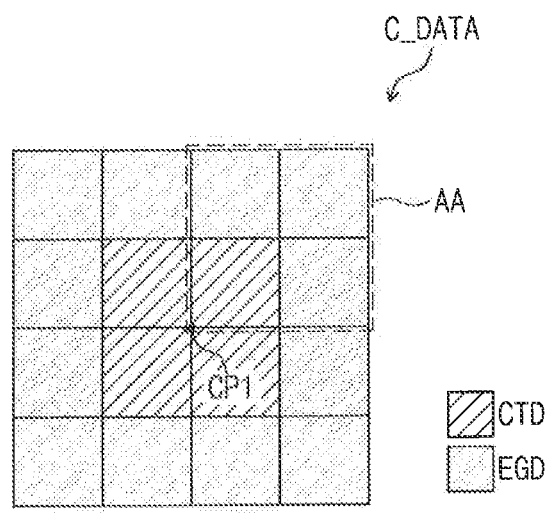
FIG. 2 is a view illustrating an image (hereinafter, referred to as a design image) that design data have.

FIG. 2 is a view illustrating an image (hereinafter, referred to as a design image) that design data C_DATA represent. Hereinafter, for convenience of description, the design data C_DATA are described with reference to a design image. Thus, a specific area of the design image may be deemed a portion of the design data C_DATA having information on the specific area.

The design data C_DATA contains information on a pattern to be formed on the substrate SB of FIG. 1.

Referring to FIG. 2, the data modification unit 20 divides the design data C_DATA into design center data CTD and edge data EGD. Compared to the design center data CTD, the edge data EGD has pattern information further away from a center point CP1 of a design image. The edge data EGD has pattern information around the design center data CTD.

The design data C_DATA including block data arranged in a 4×4 matrix is shown in FIG. 2. The data modification unit 200 sets the design center data CTD to include four block data adjacent to the center point CP1, and also sets the edge data EGD to include twelve block data surrounding the design center data CTD. Hereinafter, block data configuring the design center data CTD are defined as center block data, and block data configuring the edge data EGD are defined as edge block data.

Figure 3:
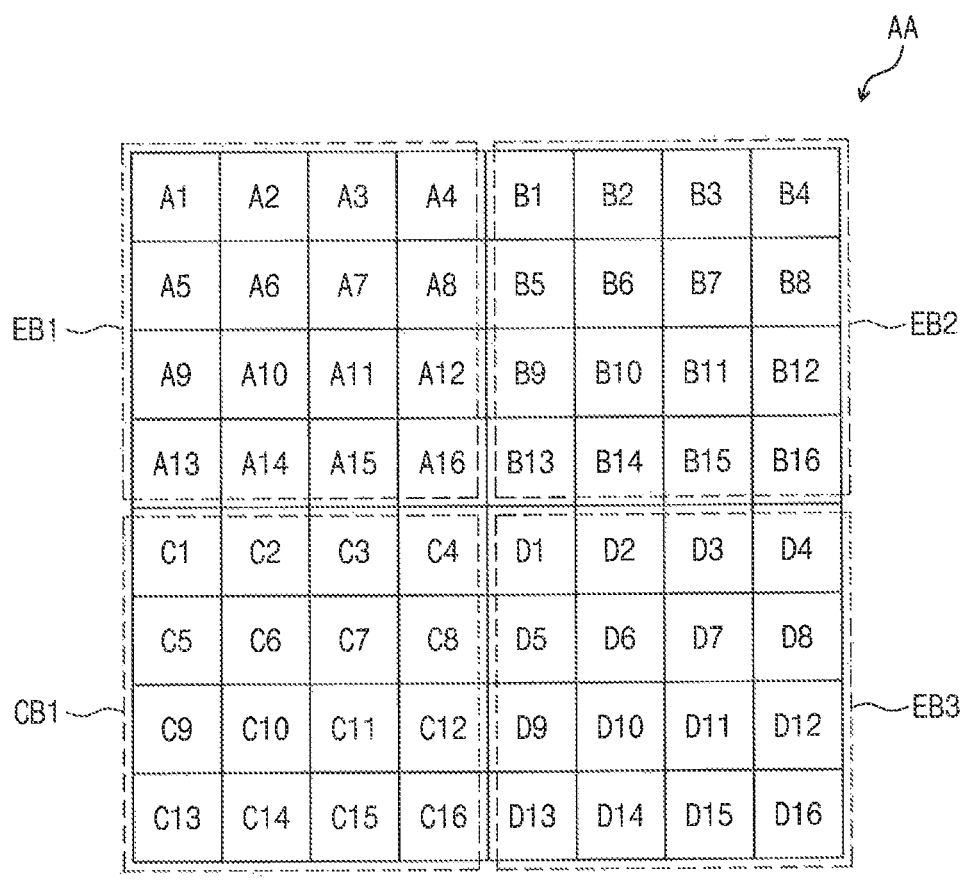
FIG. 3 is a view illustrating data in the area AA of FIG. 2.
Figure 3:
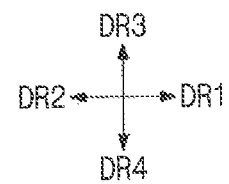

FIG. 3 is a view illustrating data in the area AA of FIG. 2.

The area AA includes one center block data CB1 and first to third edge block data EB1 to EB3 adjacent to the center block data CB1. Each of the center block data CB1 and the first to third edge block data EB1 to EB3 includes a plurality of unit data arranged in a m×n matrix (e.g., m×n matrix, wherein m and n are natural numbers). The unit data arranged in a 4×4 matrix are shown as an example.

The unit data have image information of an area and position that each occupies. The unit data correspond to a positive integer multiple of a pixel area formed in the substrate SB of FIG. 1. Thus, one unit data may include pattern information corresponding to a plurality of pixel areas. The data modification unit 200 sets the unit data so that a boundary between adjacent unit data does not cross (through) a thin film transistor (TFT) (not shown) to be formed in the pixel. If the boundary between adjacent unit data is set to cross the TFT, as the unit data are shifted, it may be impossible to fabricate the TFT in a intended form. Therefore, defects may occur.

As shown in FIG. 3, the first edge block data EB1 includes unit data A1 to A16, the second edge block data EB2 includes unit data B1 to B16, the third edge block data EB3 includes unit data D1 to D16, and the center block data CB1 includes unit data C1 to C16.

Referring to FIG. 1 again, when the substrate SB expands (e.g., due to thermal expansion) during a patterning process, the design data C_DATA need to be modulated to corresponding to the deformed substrate SB. The data modification unit 200 extends the design data C_DATA to generate the modified data M_DATA. At this point, a method of forming modified data by simply inserting some of block data in design data into the design data is not appropriate because a boundary between the inserted block data and the block data adjacent thereto could be seen as a stain or "stitch".

Figure 4:
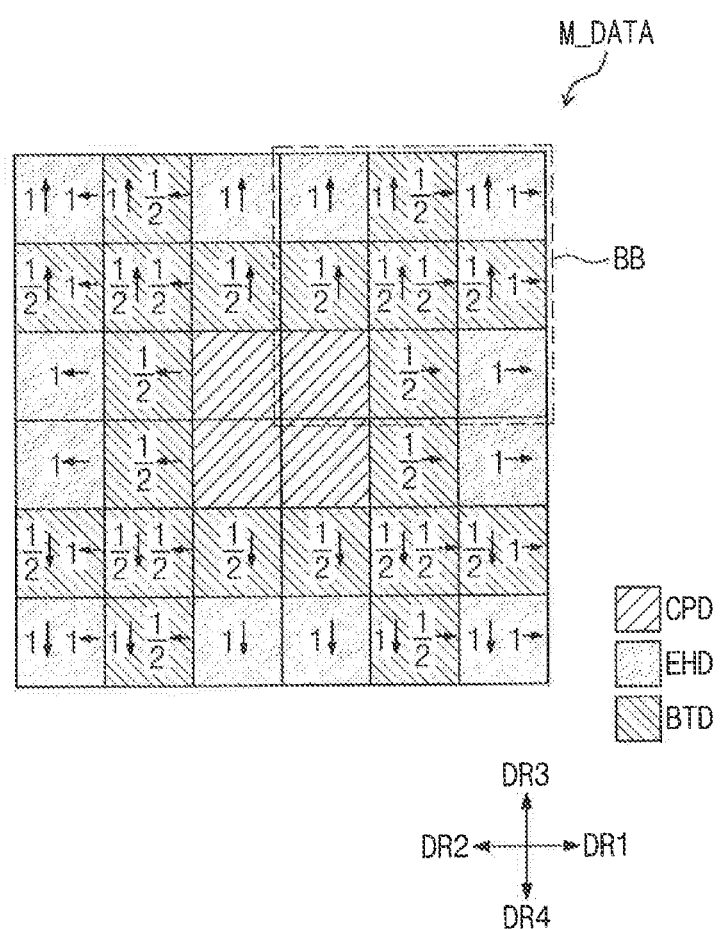
FIG. 4 is a view illustrating an image (or, a modulation image) comprised of the modified data.

FIG. 4 is a view illustrating an image (or, a modulation image) comprised of the modified data M_DATA.

As shown in FIG. 4, compared to the design data C_DATA, the modified data M_DATA extends each one block data in a first direction DR1, a second direction DR2, a third direction DR3, and/or a fourth direction DR4.

Referring to FIG. 4, the modified data M_DATA includes center data CPD, extended data EHB, and intermedial data BTD.

Referring to FIGS. 2, 3 and 4, the extended center data CPD may be identical to the design center data CTD of the original design data C_DATA of FIG. 2. Accordingly, the center data CPD includes four block data adjacent to the center point CP2. Block data forming the center data CPD are defined as center block data.

The extended data EHB are data obtained when the edge data EGD of FIG. 2 are shifted in one or more of the four expansion directions. Accordingly, the extended data EHB may have twelve block data, like the edge data EGD. Block data forming the extended data EHB are defined as extended block data.

Referring to FIG. 4, symbols 1→, 1↑, 1↓, and 1← indicated in the extended data EHB mean that unit data forming each block data of the extended data EHB are shifted in a corresponding direction. For example, 1→ means that unit data forming block data are all shifted in the first direction DR1 (e.g., "to the right" in the orientation shown).

Unit data forming the extended data EHB are shifted by the size unit of the block data.

The intermedial data BTD have pattern information on an intermediate (i.e., between) position between the center data CPD and the extended data EHB.

The intermedial data BTD are data in an area generated as the edge data EGD are shifted in one or more expansion directions. Some of unit data forming each block data of the intermedial data BTD are data that are shifted in one or more (e.g., one or two) expansion directions, and the remaining unit data are data that are not shifted in any expansion direction (e.g., any one or any two of four orthogonal expansion directions, e.g., a first, second, third or fourth expansion directions, as shown in the figures).

The intermedial data BTD are data corresponding to an (expanded) size difference of an image of the design data C_DATA and an image of the modified data M_DATA. The intermedial data BTD includes twenty block data. Block data forming the intermedial data BTD are defined as intermedial block data. The intermedial data BTD has one intermedial block data between the center data CPD and the extended data EHD in each of the four expansion directions.

According to an embodiment of the inventive concept, the half of unit data forming each block data of the intermedial data BTD is shifted in one or two expansion directions, and the remaining half is not shifted. However, the inventive concept is not limited thereto, and the ratio of unit data shifted in an expansion direction may vary (e.g., smaller than ½ or larger than ½).

Referring to FIG. 4, symbols ½→, ½↑, ½↓, and ½← indicated in the intermedial data BTD mean that the half of unit data forming each block data of the intermedial data BTD is shifted in a corresponding expansion direction. For example, ½→ means that the half of unit data forming block data is shifted in the first direction DR1, and the remaining half is not shifted in the first direction DR1. And, ½↑ means that the half unit data forming block data is shifted in the first direction DR1 and the remaining half is not shifted in the first direction DR1, And ½↓ means that the half unit data forming block data is shifted in the third direction DR3 and the remaining half is not shifted in the third direction DR3.

Some of unit data (e.g., "1↓") forming the intermedial data are shifted by one size unit of block data.

Figure 5:
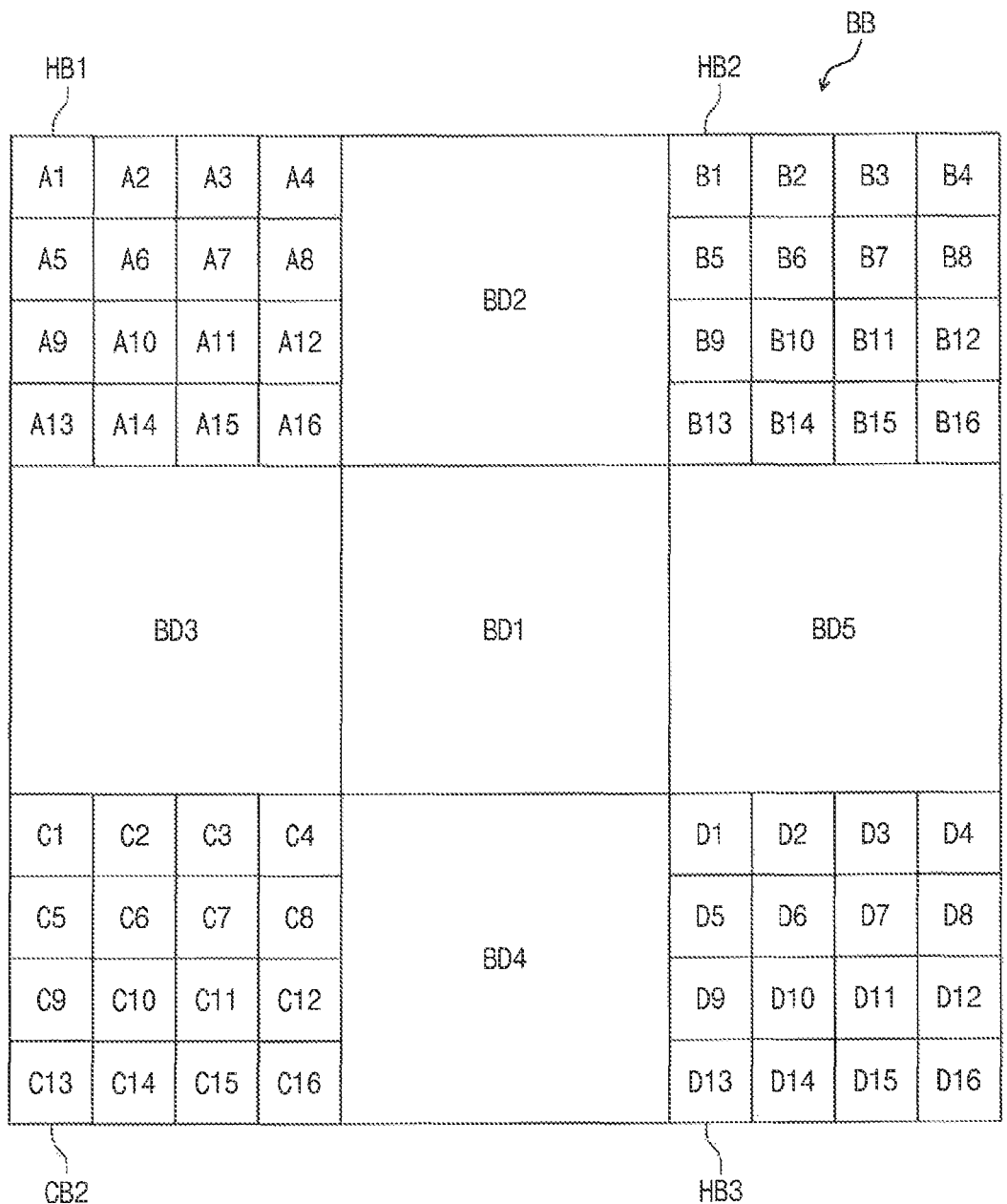
FIG. 5 is a view illustrating data in the area BB of FIG. 4.

FIG. 5 is a view illustrating data in the area BB of FIG. 4.

The area BB includes one center block data CB2 and first to third extended block data HB1 to HB3, and first to fifth intermedial block data BD1 to BD5. Each of the center block data CB2, the first to third extended block data HB1 to HB3, and the first to fifth intermedial block data BD1 to BD5 can include a plurality of unit data arranged in a matrix. As shown in FIG. 5, the unit data in each of the four corner-situated blocks are arranged in a 4×4 matrix exemplarily.

The unit data have image information of an area that each occupies in its position. The unit data correspond to a positive integer multiple of a pixel area formed on the substrate SB of FIG. 1. Thus, one unit data may have pattern information corresponding to a plurality of pixel areas. The data modification unit 200 sets the unit data so that each boundary between adjacent unit data does not cross a TFT (not shown) to be formed on each pixel.

Hereinafter, a process of generating the modified data M_DATA by modifying the design data C_DATA through the data modification unit 200 will be described.

Since the area AA of FIG. 3 is an area corresponding to ¼ of the design data C_DATA, and the area BB of FIG. 5 is an area corresponding to ¼ of the modified data M_DATA corresponding to the area AA, hereinafter, a process of generating the area BB from the area AA will be described, and detailed description of generating the remaining ¾ of area is omitted because it is symmetrically the same and because of its redundant nature.

First, since the center block data CB2 of the area BB are identical to the center block data CB1 in the area AA, the center block data CB2 includes unit data C1 to C16.

The first extended block data HB1 are data obtained when the first edge block data EB1 are shifted by the size of one block data in the third direction DR3. Accordingly, the first extended block data HB1 may include the same unit data A1 to A16 as the first edge block data EB1, as shown in FIG. 5. The second extended block data HB2 are data obtained when the second edge block data EB2 are shifted by the size of one block data in each of the first and third directions DR1 and DR3. Accordingly, the second extended block data HB2 may include the same unit data B1 to B16 as the second edge block data EB2, as shown in FIG. 5. The third extended block data HB3 are data obtained when the third edge block data EB3 are shifted by the size of one block data in the first direction DR1. Accordingly, the third extended block data HB3 may include the same unit data D1 to D6 as the third edge block data EB3, as shown in FIG. 5.

Thus, all the unit data forming the first to third edge block data EB1 to EB3 are shifted by the size of block data in at least one expansion direction, thereby configuring the first to third extended block data HB1 to HB3.

Figure 6:
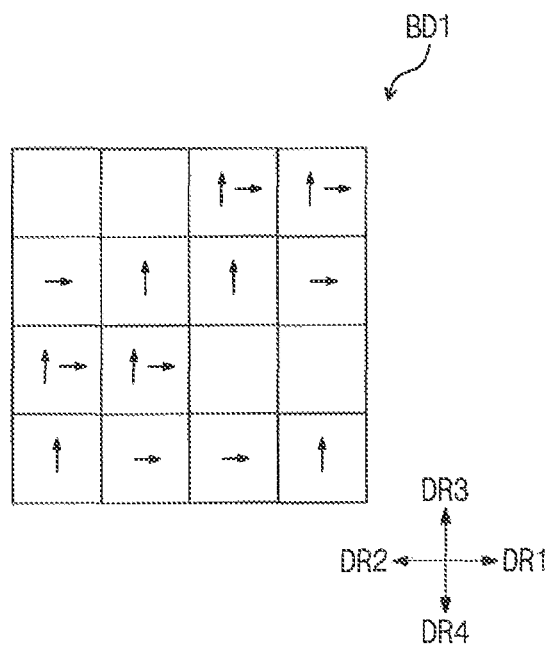
FIG. 6 is a view illustrating shifted unit data among unit data forming first intermedial block data and a shifted direction.
Figure 7:
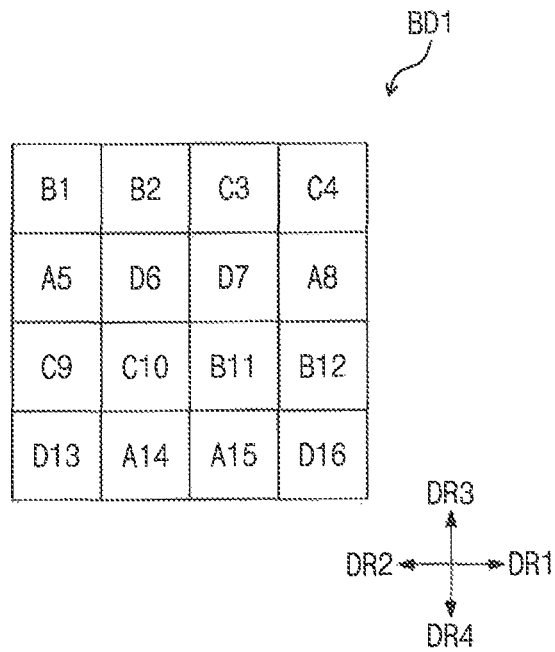
FIG. 7 is a view illustrating unit data that the first intermedial block data of FIG. 6 has.

FIG. 6 is a view illustrating shifted unit data among unit data forming first intermedial block data BD and the shifted direction(s). FIG. 7 is a view illustrating unit data that the first intermedial block data BD1 of FIG. 6 includes.

The half of unit data forming the first intermedial block data BD1 is shifted in the first direction DR1, and the remaining half is not shifted in the first direction DR1. Moreover, the half of unit data forming the first intermedial block data BD1 is shifted in the third direction DR3 and the remaining half is not shifted in the third direction DR3. Some of the half of unit data forming the first intermedial block data BD1 is not shifted at all.

The first intermedial block data BD1 may include unit data arranged in an m×n matrix (m and n are natural numbers). At this point, the number of unit data shifted in the first direction DR1 among unit data forming one row is n/2, and the number of unit data shifted in the first direction DR1 among unit data forming one column is m/2. Additionally, the number of unit data shifted in the third direction DR3 among unit data forming one row is n/2, and the number of unit data shifted in the third direction DR3 among unit data forming one column is m/2.

As shown in FIG. 6, since the first intermedial block data BD1 includes unit data arranged in a 4×4 matrix, the number of unit data shifted in the first direction DR1 among unit data forming one row or each one column is 2, and the number of unit data shifted in the third direction DR3 among unit data forming one row or each column is 2.

Referring to FIGS. 3 and 5 to 7, a process of forming unit data that constitute the first row of the first intermedial block data BD1 will be described in more detail. Since the remaining unit data of the first intermedial block data BD1 are formed through the same process, its detailed description is omitted.

The first row and first column unit data and the first row and second column unit data of the first intermedial block data BD1 are data that are not shifted in any direction. Accordingly, the first row and first column unit data B1 and the first row and second column unit data B2 of the first intermedial block data BD1 are identical to the first row and first column unit data B and the first row and second column unit data B2 of the second edge block data EB2.

The first row and third column unit data and the first row and fourth column unit data of the first intermedial block data BD1 are data that are shifted in the first direction DR1 and the third direction DR3. Accordingly, the first row and third column unit data C3 and the first row and fourth column unit data C4 of the first intermedial block data BD1 are data obtained when the first row and third column unit data C3 and the first row and fourth column unit data C4 of the center block data CB1 are shifted by the size of block data in the first direction DR1 and the third direction DR3.

As shown in FIG. 7, the first intermedial block data BD1 may include some unit data of the center block data CB1 of FIG. 3 and some unit data of the first to third edge block data EB1 to EB3.

Figure 8A:
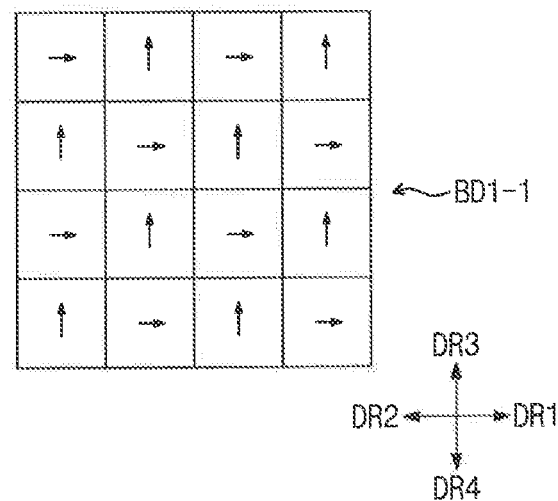
FIGS. 8A, 8B and 8C are views illustrating shifted unit data among unit data forming the first intermedial block data and the shifted direction(s) thereof according to various embodiments of the inventive concept.
Figure 8B:
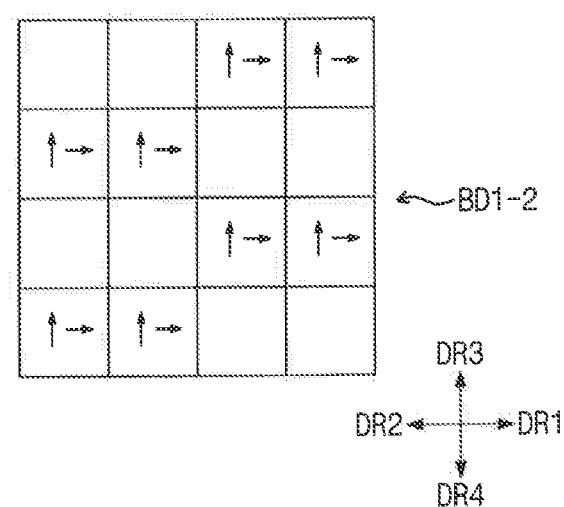
Figure 8C:
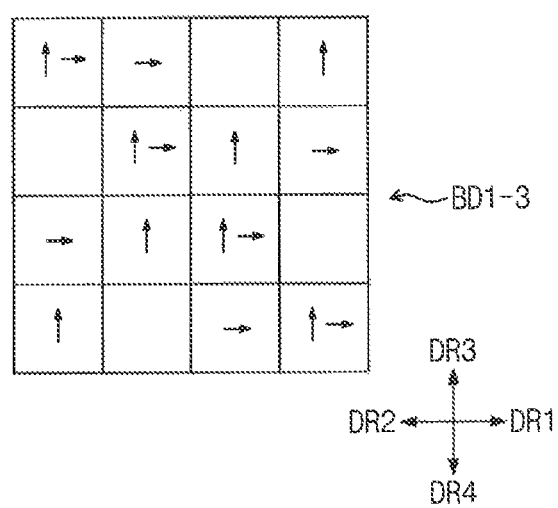

FIGS. 8A, 8B, and 8C are views illustrating shifted unit data among unit data forming the first intermedial block data BD1-1, BD1-2, and BD1-3 and a shifted direction according to various alternative embodiments of the inventive concept.

The number of unit data shifted in the first direction DR1 among unit data forming one row or column in the first intermedial block data BD1-1, BD1-2, and BD1-3 shown in FIGS. 8A to 8C is two, and the number of unit data shifted in the third direction DR3 among unit data forming one row or column is two.

Hereinafter, a process of generating second to fifth intermedial block data BD2 to BD5 is described with reference to FIGS. 9 and 15. Since the process of generating the second to fifth intermedial block data BD2 to BD5 is similar to the process of generating the first intermedial block data BD1 described with reference to the FIGS. 6 and 7, its redundant description is omitted.

Figure 9:
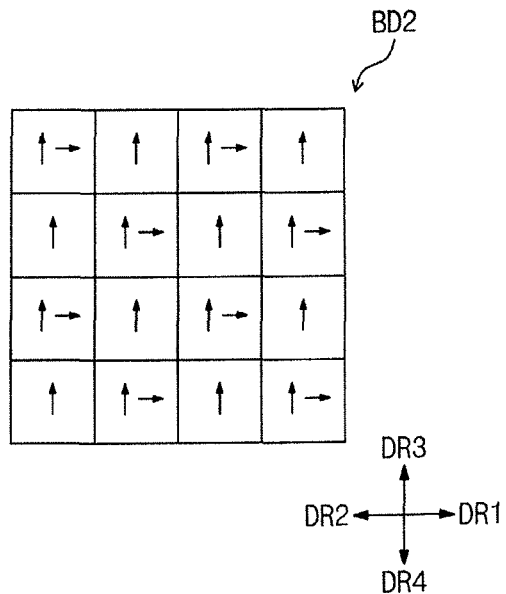
FIG. 9 is a view illustrating shifted unit data among unit data forming the second intermedial block data and the shifted direction(s) thereof.
Figure 10:
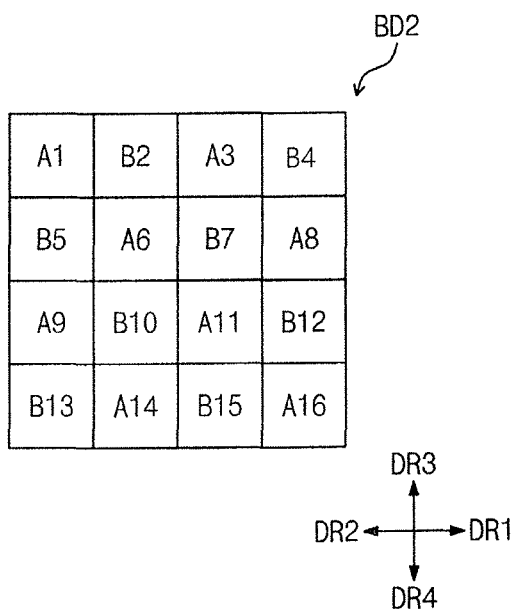
FIG. 10 is a view illustrating unit data that the second intermedial block data of FIG. 9 have.

FIG. 9 is a view illustrating shifted unit data among unit data forming the second intermedial block data BD2 and the shifted direction(s) thereof. FIG. 10 is a view illustrating unit data that the second intermedial block data BD2 of FIG. 9 have.

The half of unit data forming the second intermedial block data BD2 is shifted in the first direction DR1, and the remaining half is not shifted in the first direction DR1. Moreover, all unit data forming the second intermedial block data BD2 are shifted in the third direction DR3.

The second intermedial block data BD2 may include unit data arranged in an m×n matrix (m and n are natural numbers). At this point, the number of unit data shifted in the first direction DR1 among unit data forming one row is n/2, and the number of unit data shifted in the first direction DR1 among unit data forming one column is m/1. Additionally, the number of unit data shifted in the third direction DR3 among unit data forming one row is n (n/1), and the number of unit data shifted in the third direction DR3 among unit data forming one column is m (m/1).

Figure 11:
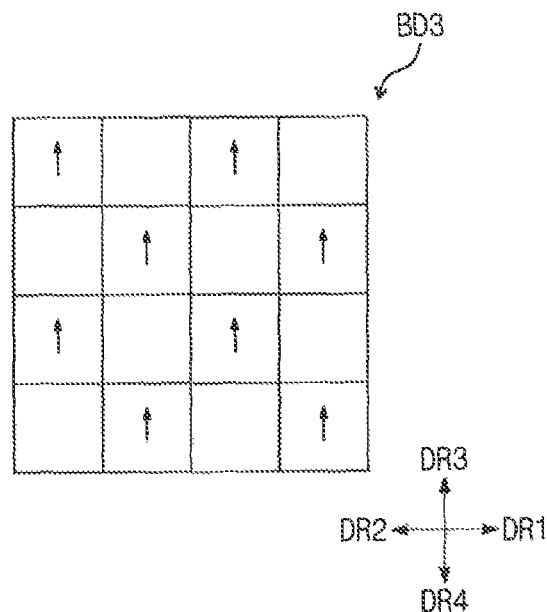
FIG. 11 is a view illustrating shifted unit data among unit data forming the third intermedial block data and the shifted direction thereof.
Figure 12:
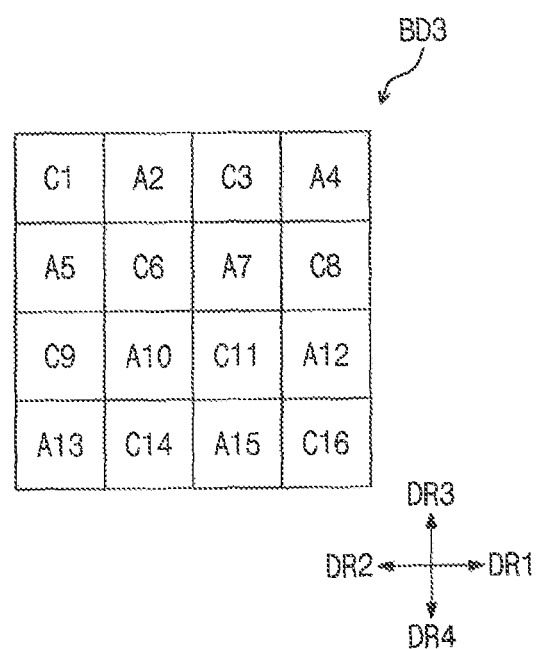
FIG. 12 is a view illustrating unit data that the third intermedial block data of FIG. 10 have.

FIG. 11 is a view illustrating shifted unit data among unit data forming the third intermedial block data BD3 and the shifted direction thereof. FIG. 12 is a view illustrating unit data that the third intermedial block data BD3 of FIG. 10 have.

The half of unit data forming the third intermedial block data BD3 is shifted in the third direction DR3, and the remaining half is not shifted in the third direction DR3.

The third intermedial block data BD3 may include unit data arranged in an m×n matrix (m and n are natural numbers). At this point, the number of unit data shifted in the third direction DR3 among unit data forming one row is n/2, and the number of unit data shifted in the third direction DR3 among unit data forming one column is m/2.

Figure 13:
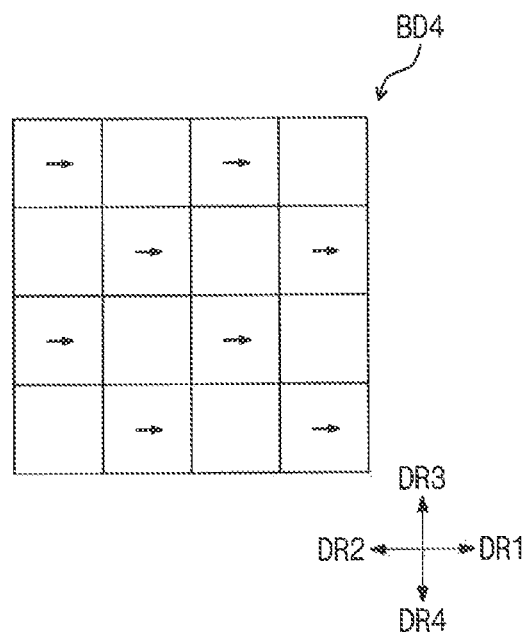
FIG. 13 is a view illustrating shifted unit data among unit data forming the fourth intermedial block data and the shifted direction thereof.
Figure 14:
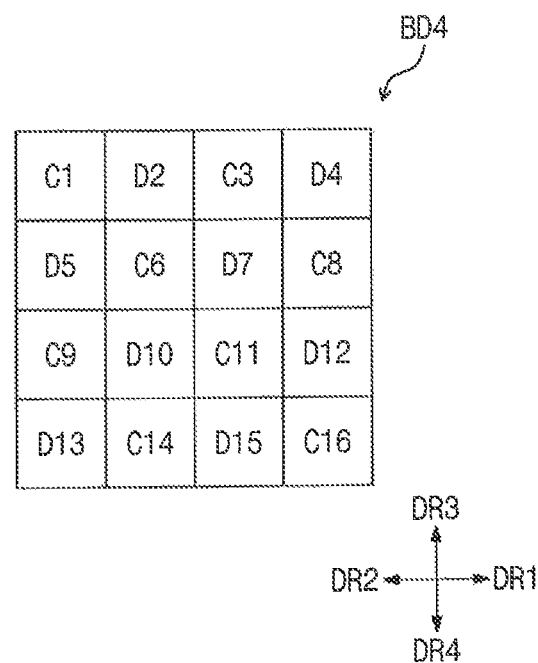
FIG. 14 is a view illustrating unit data that the fourth intermedial block data of FIG. 13 have.

FIG. 13 is a view illustrating shifted unit data among unit data forming the fourth intermedial block data BD4 and the shifted direction thereof. FIG. 14 is a view illustrating unit data that the fourth intermedial block data BD4 of FIG. 13 have.

The half of unit data forming the fourth intermedial block data BD4 is shifted in the first direction DR1, and the remaining half is not shifted in the first direction DR1.

The fourth intermedial block data BD4 may include unit data arranged in an m×n matrix (m and n are natural numbers). At this point, the number of unit data shifted in the first direction DR1 among unit data forming one row is n/2, and the number of unit data shifted in the first direction DR1 among unit data forming one column is m/2.

Figure 15:
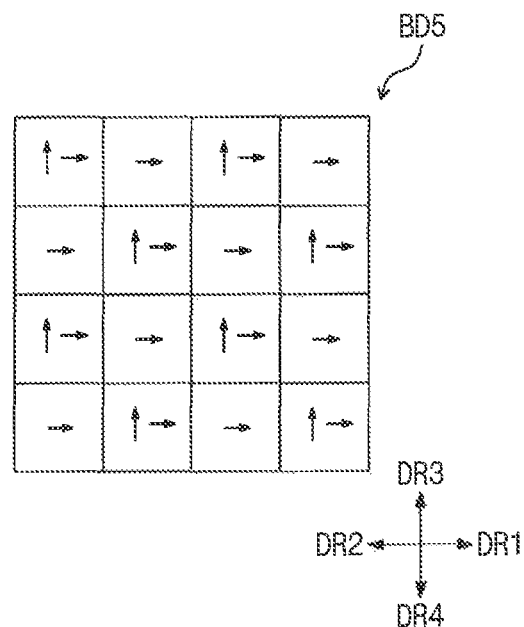
FIG. 15 is a view illustrating shifted unit data among unit data forming the fifth intermedial block data and the shifted direction(s) thereof.
Figure 16:
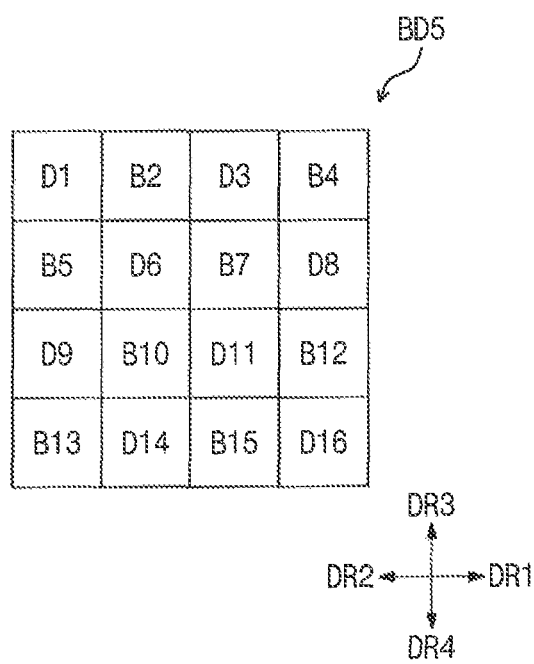
FIG. 16 is a view illustrating unit data that the fifth intermedial block data BD5 of FIG. 15 have.

FIG. 15 is a view illustrating shifted unit data among unit data forming the fifth intermedial block data BD5 and the shifted direction(s) thereof. FIG. 16 is a view illustrating unit data that the fifth intermedial block data BD5 of FIG. 15 have.

The half of unit data forming the fifth intermedial block data BD5 is shifted in the third direction DR3, and the remaining half is not shifted in the third direction DR3. Moreover, all unit data forming the fifth intermedial block data BD5 are shifted in the first direction DR1.

The fifth intermedial block data BD5 may include unit data arranged in an m×n matrix (m and n are natural numbers). At this point, the number of unit data shifted in the third direction DR3 among unit data forming one row is n/2, and the number of unit data shifted in the third direction DR3 among unit data forming one column is m/2. Furthermore, the number of unit data shifted in the first direction DR1 among unit data forming one row is n, and the number of unit data shifted in the first direction DR1 among unit data forming one column is m.

According to an embodiment of the inventive concept, the data modification unit 200 generates modified data including intermedial data obtained when some unit data are shifted in any expansion direction. The intermedial data serves to alleviate a data difference between center data and extended data. Compared to a method of inserting some of block data forming typical design data into the typical design data as they are to form modified data, the inventive concept may reduce an area where stains or stitches are seen after pattern formation by less than ½.

Figure 17:
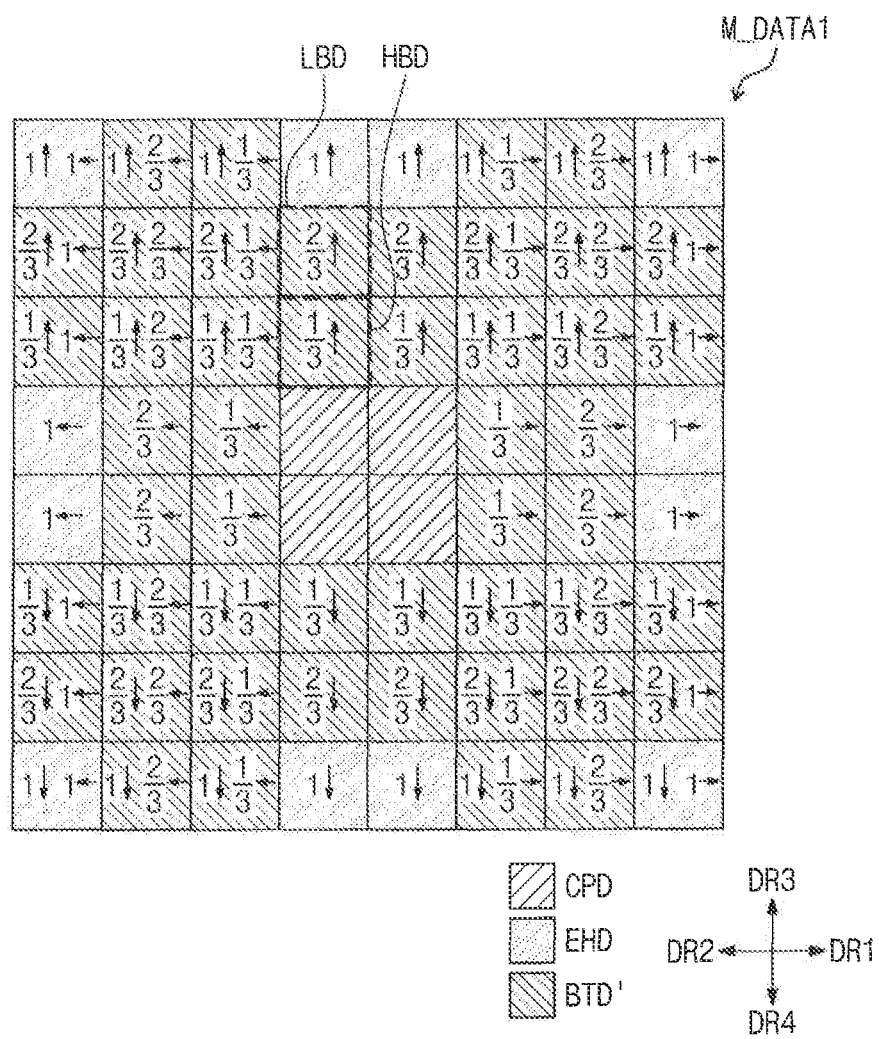
FIG. 17 is a view illustrating an image of an alternative form of the modified data M_DATA1.

FIG. 17 is a view illustrating an image of an alternative form of the modified data M_DATA1.

Compared to the modified data M_DATA of FIG. 4, the modified data M_DATA shown in FIG. 17 has a difference in the number of intermedial data, and is substantially the same in other aspects.

In relation to the modified data M_DATA of FIG. 4, the intermedial data BTD has one intermedial block data between the center data CPD and the extended data EHD in each expansion direction, and the half of unit data forming each intermedial block data is shifted in one or two expansion directions.

Referring to FIG. 17, there are k of intermedial block data BTD' (k is a natural number equal to or greater than 2) between the center data CPD and the extended data EHD in each expansion direction, and the ratio of unit data shifted in the expansion direction among unit data forming the intermedial block data may be $i/(k+1)$. (i is a natural number satisfying the following equation, $1/(k+1) \leq i/(k+1) \leq k/(k+1)$).

The ratio of unit data shifted in the expansion direction among unit data forming each of the intermedial block data LBD and HBD may vary.

The ratio of unit data shifted in each expansion direction among unit data forming each of the intermedial block data LBD and HBD may become greater as it progressively approaches the expansion direction. Thus, the ratios of the unit data shifted in the first expansion direction increases the further each unit data is situated in the first expansion direction, and meanwhile the ratios of the unit data shifted in the second expansion direction increases the further each unit data is situated in the second expansion direction, etcetera, as illustrated in the example of FIG. 17.

As shown in FIG. 17, k is 2, for example. Thus intermedial data BTD' has two intermedial block data LBD and HBD between the center data CPD and the extended data EHD. The two intermedial block data LBD and HBD are defined as low intermedial block data LBD and high intermedial block data HBD, respectively. The ratio of unit data shifted in the third direction DR3 among unit data forming the low intermedial block data LBD may be ⅓ as shown. The ratio of unit data shifted in the third direction DR3 among unit data forming the high intermedial block data HBD may be ⅔ as shown.

The low intermedial block data LBD and the high intermedial block data HBD include unit data arranged in an m×n matrix (m and n are natural numbers).

The number of unit data shifted in the expansion direction amount unit data of the intermedial block data forming one row is $(n \times j)/(k+1)$ (j is a natural number satisfying the following equation, $n/(k+1) \leq (n \times j)/(k+1) < n$). Additionally, the number of unit data shifted in the expansion direction among unit data of the intermedial block data forming one column is $(m \times u)/(k+1)$ (u is a natural number satisfying the following equation, $m/(k+1) \leq (m \times i)/(k+1) < m$).

The number of unit data shifted in the third direction DR3 among unit data forming one row of the low intermedial block data LBD is n/3, and the number of unit data shifted in the third direction DR3 among unit data forming one column is m/3.

The number of unit data shifted in the third direction DR3 among unit data forming one row of the high intermedial block data HBD is 2n/3, and the number of unit data shifted in the third direction DR3 among unit data forming one column is 2m/3.

According to another embodiment of the inventive concept, by further alleviating a data difference between center data and extended data with a plurality of intermedial block data between the center data and the extended data, an area where stains or stitches seen after pattern formation occur can be further reduced.

According to an embodiment of the inventive concept, a digital exposure device reduces stains and stitches by exposing a substrate on the basis of modified data generated by extending design data to form an expanded pattern.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A digital exposure device implemented with one or more processor, comprising:
   a data modification unit configured to receive design data comprising design center data and edge data having pattern information disposed around the design center data, and generate modified data by expanding the design data in accordance with a dimensionally expandable substrate; and
   a digital exposure unit receiving the modified data and configured to project a light modulated according to the modified data onto the substrate,
   wherein the modified data includes the received design data and intermedial block data corresponding to a size difference between an image of the received design data and an expanded image of the modified data adapted to the dimensionally expandable substrate, wherein some of unit data forming the intermedial block data are data obtained from unit data of the design data being shifted in at least a first expansion direction of the substrate, wherein the modified data further comprises center data identical to the design center data and extended data obtained when the edge data are shifted in the first expansion direction, the intermedial block data disposed between the center data and the extended data shifted in the first expansion direction and comprising a plurality of unit data, wherein a ratio of unit data shifted in the first expansion direction among the unit data forming the intermedial block data is based on a ratio of block distance from the center data to the intermedial block data versus from the center data to the extended data, and wherein the digital exposure unit is configured to project light modulated according to the modified data onto the substrate, wherein the unit data forming the intermedial block data are used to modulate the light applied to the substrate in a matrix arrangement, and wherein the number of unit data shifted in the first expansion direction among unit data of the intermedial block data forming one row or column is based on the ratio of unit data and the number of unit data in the intermedial block data multiplied by a monotonically increasing ratio of horizontal block distance from the center data to the intermedial block data versus from the center data to the extended data.

2. The digital exposure device of claim 1, wherein the remaining unit data of the unit data forming the intermedial block data are data obtained from the unit data of the design data not being shifted in the first expansion direction.

3. The digital exposure device of claim 1, wherein the modified data further comprise:
center data identical to the design center data;
extended data obtained when the edge data are shifted in the first expansion direction;
extended data obtained when the edge data are shifted in a second expansion direction;
extended data obtained when the edge data are shifted in a third expansion direction; and
extended data obtained when the edge data are shifted in a fourth expansion direction.

4. The digital exposure device of claim 3, wherein the unit data forming the extended data and some of the unit data forming the intermedial block data are shifted by a size unit of block data.

5. The digital exposure device of claim 1, wherein the ratio of unit data shifted in the first expansion direction among unit data forming each of the intermedial block data is different from the ratio of unit data shifted in a second expansion direction among unit data forming each of the intermedial block data.

6. The digital exposure device of claim 5, wherein the ratio of the unit data shifted in the first expansion direction among the unit data forming the intermedial block data increases the further each unit data is situated in the first expansion direction.

7. The digital exposure device of claim 1, wherein the number of unit data shifted in the first expansion direction among unit data of the intermedial block data forming one row is $(n \times j)/(k+1)$ (j is a natural number satisfying the following equation, $n/(k+1) \leq (n \times j)/(k+1) < n$).

8. The digital exposure device of claim 1, wherein the number of unit data shifted in the first expansion direction among unit data of the intermedial block data forming one column is $(m \times u)/(k+1)$ (u is a natural number satisfying the following equation, $m/(k+1) \leq (m \times u)/(k+1) < m$).

9. The digital exposure device of claim 1 wherein there is one intermedial block data between the center data and the expanded data shifted in the first expansion direction.

10. The digital exposure device of claim 9, wherein a proportion of unit data shifted in the first expansion direction among unit data of the intermedial block data forming one row is half.

11. The digital exposure device of claim 9, wherein the proportion of unit data shifted in the first expansion direction among unit data of the intermedial block data forming one column is half.

12. The digital exposure device of claim 1, wherein each of unit data forming the design data and the modified data corresponds to a positive integer multiple of a pixel area formed in the substrate.

13. The digital exposure device of claim 12, wherein a boundary between adjacent unit data does not cross a thin film transistor formed on the pixel.

14. The digital exposure device of claim 1, further comprising a stage configured to seat and support the substrate on which a pattern is to be formed and controlled to move substrate in a scan direction.

15. The digital exposure device of claim 1 wherein the design data comprises data corresponding to matrix pixels of a display device to be formed on the substrate, said pixels having transistors, and at least one of the center data or extended data includes fractional portions of the pixels greater than or equal to the portions occupied by the transistors such that boundaries of the intermedial block data remain clear of the transistors.

16. The digital exposure device of claim 15 wherein there are a plurality of intermedial block data between the center data and the extended data, the unit data of each intermedial block data including fractional portions of the pixels greater than or equal to the portions occupied by the transistors such that boundaries among the plurality of intermedial block data remain clear of the transistors.

17. A digital exposure device implemented with one or more processor, comprising:
a data modification unit configured to receive design data including design center data and edge data and to generate modified data including center data corresponding to the design center data, extended data corresponding to the edge data, and intermedial block data therebetween by expanding the design data to compensate for thermal expansion of a substrate; and
a digital exposure unit receiving the modified data and configured to project light modulated according to the modified data onto the substrate while thermally expanding the substrate,
wherein the modified data includes the received design data and intermedial data corresponding to a size difference between an image of the received design data and an expanded image of the modified data adapted to the thermal expansion of the substrate and wherein some unit data forming the intermedial block data are data obtained from unit data of the design data being shifted in at least a first expansion direction,
wherein the intermedial block data have at least one intermedial block data between the center data and the extended data shifted in the first expansion direction,
wherein a ratio of unit data shifted in the first expansion direction among the unit data forming the intermedial block data is based on the ratio of block distance from the center data to the intermedial block data versus from the center data to the extended data, and wherein the digital exposure unit is configured to project light modulated according to the modified data and the intermedial block data onto the substrate, wherein the unit data forming the intermedial block data are arranged in a matrix and the number of unit data shifted in the first expansion direction among unit data of the intermedial block data forming one row or column is based on the ratio of unit data and the number of unit data in the intermedial block data multiplied by a monotonically increasing ratio of horizontal block distance from the center data to the intermedial block data versus from the center data to the extended data.

18. The digital exposure device of claim 17 wherein the unit data of the intermedial block data forms at least one of a row or a column.

19. The digital exposure device of claim 17 wherein:

the design data comprises data corresponding to matrix pixels of a display device to be formed on the substrate, said pixels having transistors, and at least one of the center data or extended data includes fractional portions of the pixels greater than or equal to the portions occupied by the transistors such that boundaries of the intermedial block data remain clear of the transistors, and there is a plurality of intermedial block data between the center data and the extended data, the unit data of each intermedial block data including fractional portions of the pixels greater than or equal to the portions occupied by the transistors such that boundaries among the plurality of intermedial block data remain clear of the transistors.

* * * * *